(12) United States Patent
Bach et al.

(10) Patent No.: US 7,106,073 B1
(45) Date of Patent: Sep. 12, 2006

(54) METHOD AND SYSTEM FOR AREA EFFICIENT CHARGE-BASED CAPACITANCE MEASUREMENT

(75) Inventors: Randall Bach, Stillwater, MN (US); Jeffrey Sather, Plymouth, MN (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 11/140,142

(22) Filed: May 27, 2005

(51) Int. Cl.
*G01R 27/26* (2006.01)
(52) U.S. Cl. .................... 324/678; 324/765; 324/158.1
(58) Field of Classification Search ............... None
See application file for complete search history.

(56) References Cited

U.S. PATENT DOCUMENTS

| | | | |
|---|---|---|---|
| 5,212,454 A * | 5/1993 | Proebsting | 324/678 |
| 6,300,765 B1 | 10/2001 | Chen | 324/519 |
| 6,934,669 B1 * | 8/2005 | Suaya et al. | 703/14 |

OTHER PUBLICATIONS

IEEE Electron Device Letters; vol. 18, No. 1, Jan. 1997; A Simple Method for On-Chip, Sub-Femto Farad Interconnect Capacitance Measurement; Bruce W. McGaughy, James C. Chen, Dennis Sylvester and Chenming Hu.

* cited by examiner

*Primary Examiner*—Ha Tran Nguyen
*Assistant Examiner*—Jimmy Nguyen
(74) *Attorney, Agent, or Firm*—Suiter, West, Swantz, PC LLO

(57) ABSTRACT

The present invention is directed to a system for area efficient charge-based capacitance measurement requiring a minimum silicon area for probe pads. A structure block for the system includes several test structures coupled to a target test capacitance structure, a reference structure, and a logic block. Each test structure is coupled to a corresponding test capacitance structure. The logic block coupled to the several test structures selects a desirable test structure from the several test structures. The system may include several structure blocks and an additional logic block to select a desirable structure block. Each structure block includes a single output pin for busing each test output from the several test structures. In this manner, the silicon area may be minimized through reduction of the number of total pins and probe pads required.

24 Claims, 4 Drawing Sheets

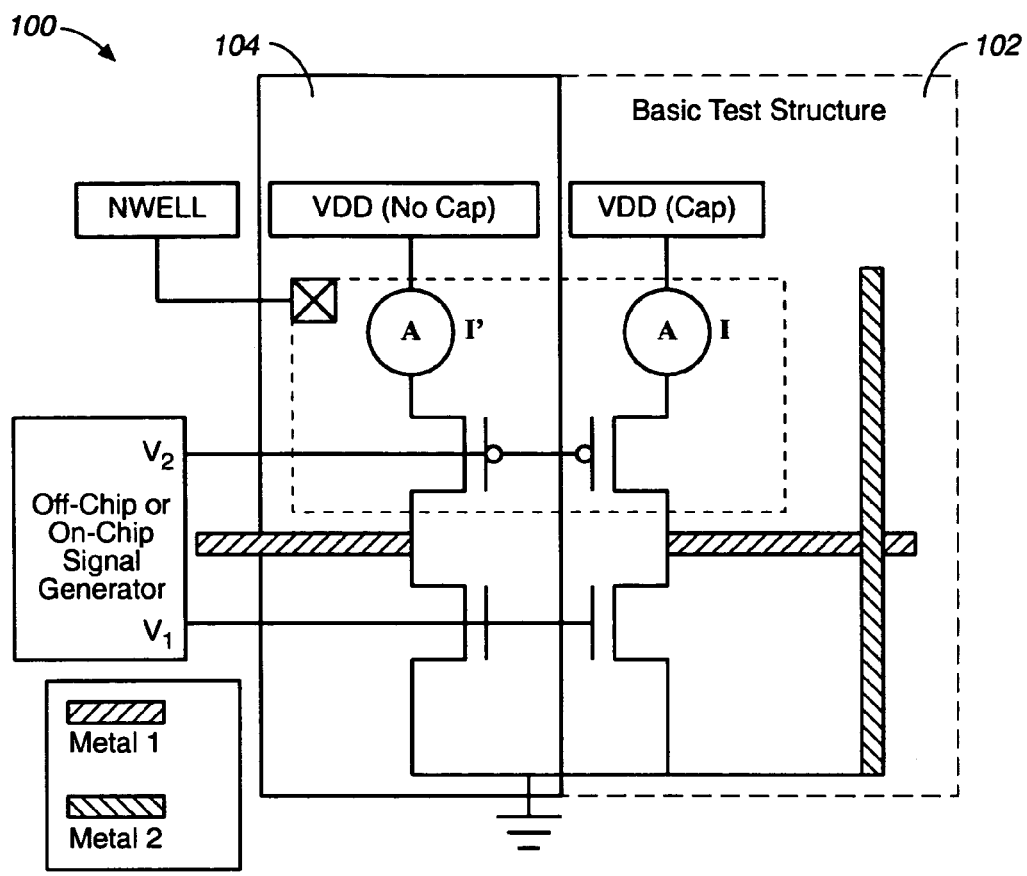
FIG._1 (PRIOR ART)
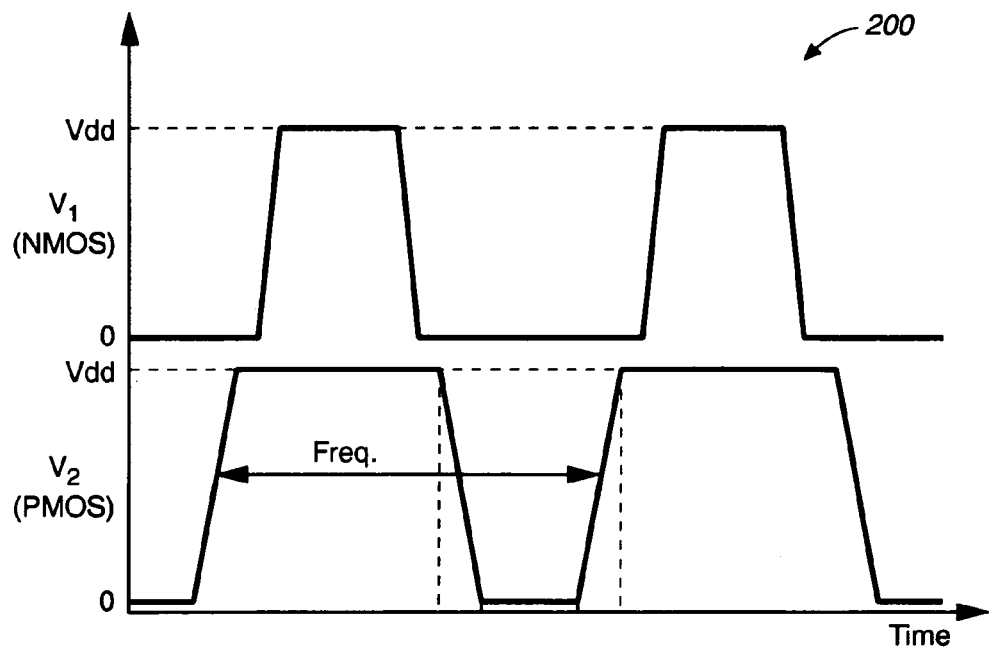
FIG._2 (PRIOR ART)

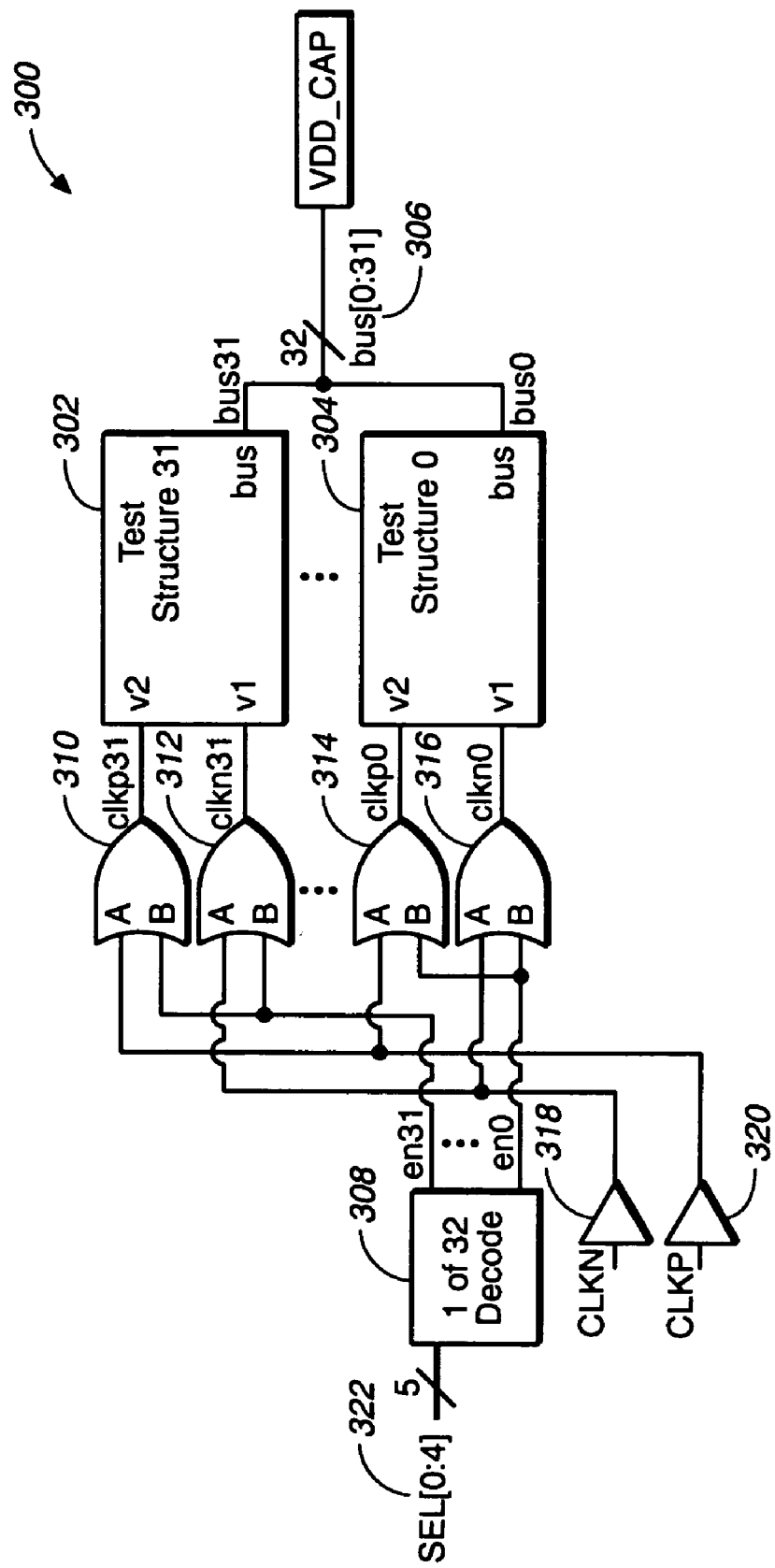
FIG._3

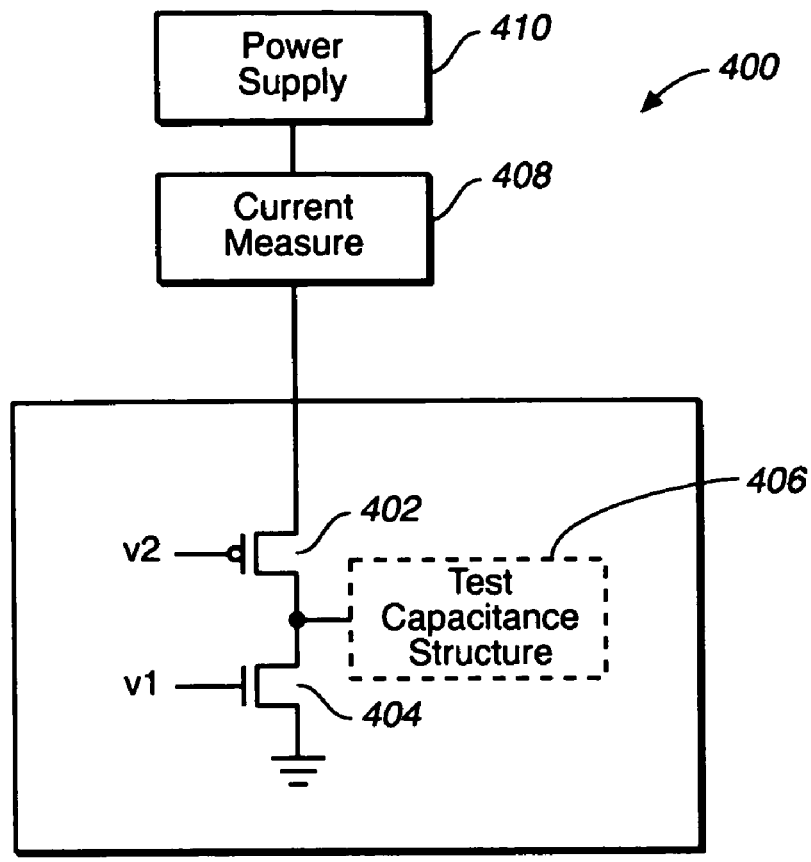
FIG._4
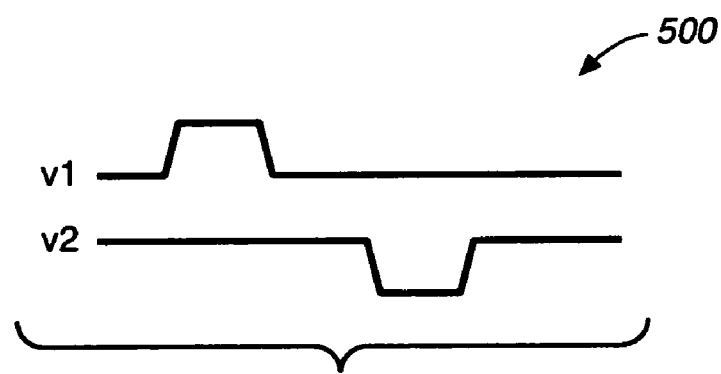
FIG._5

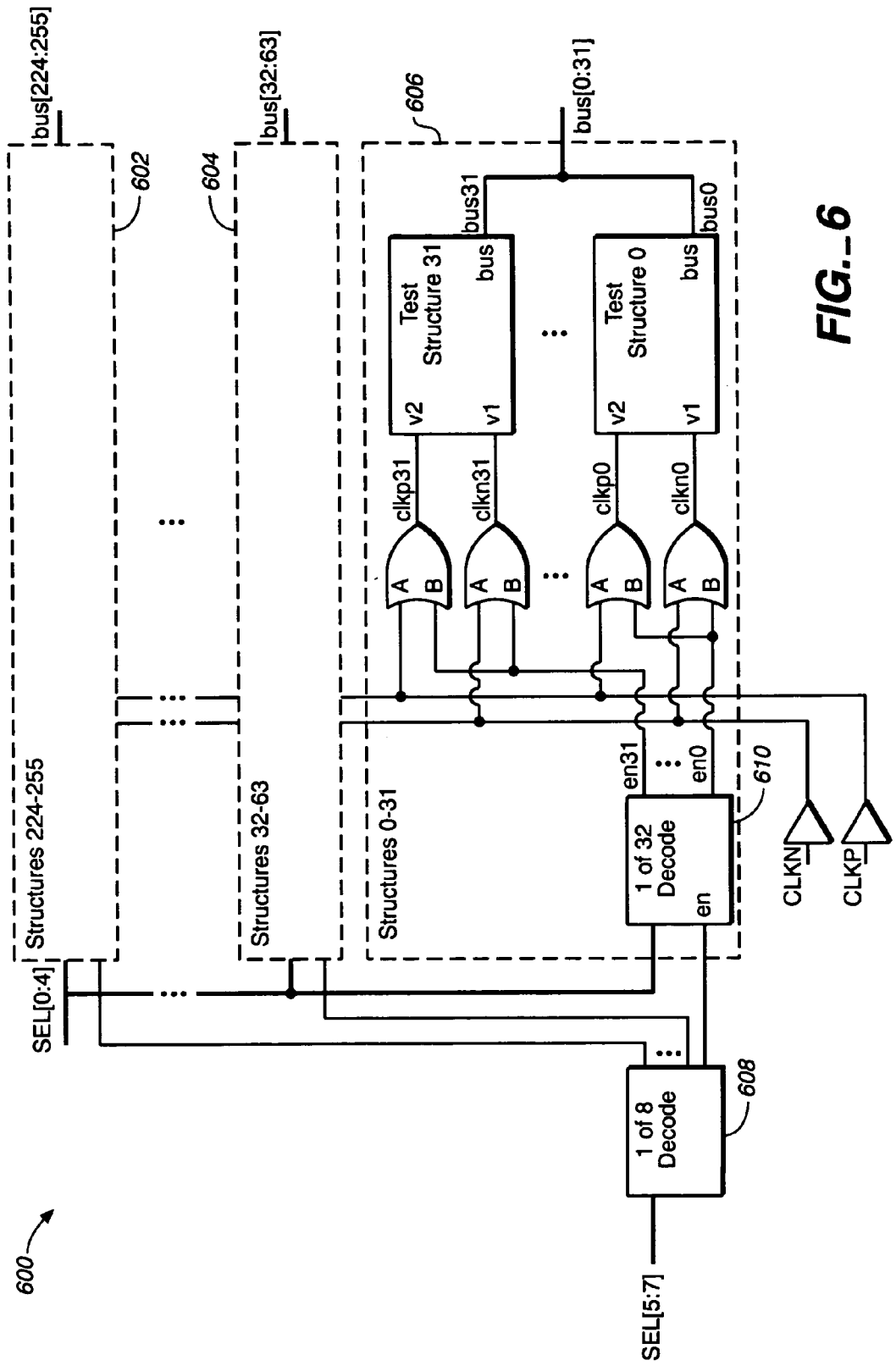
FIG._6

METHOD AND SYSTEM FOR AREA EFFICIENT CHARGE-BASED CAPACITANCE MEASUREMENT

FIELD OF THE INVENTION

The present invention generally relates to the field of semiconductor testing, and particularly to a system for area efficient charge-based capacitance measurement (CBCM) in semiconductor testing.

BACKGROUND OF THE INVENTION

The performance of today's deep sub-micron semiconductor processes is becoming more dependent upon the parasitic capacitances of metal interconnects. The parasitic capacitances are formed due to the coupling between a metallic interconnect and a substrate or between pairs of metallic interconnects. In order to properly calibrate CAD tools which extract interconnect capacitances from completed layouts, test chips are often designed and fabricated with many test structures composed of accurately controlled interconnect geometries. When the capacitance of these various structures is measured on the actual silicon, they are compared with the extracted results to assess the degree of correlation. If discrepancies exist, the information is taken back to the vendor of the CAD tool whereby enhancements can be made to improve the extraction accuracy.

One of the conventional test structures has been described in a paper, "A Simple Method for On-Chip, Sub-Femto Farad Interconnect Capacitance Measurement" by McGaughy, Chen, Sylvester and Hu in the IEEE Electron Device Letters, Vol. 18, No. 1, January 1997. FIG. 1 is a block diagram of a test structure 100 described in the above mentioned paper which illustrates an example test structure design.

The test structure 100 consists of a pseudo-inverter driving the interconnect geometry which is a vertical Metal 2 line creating an overlap capacitance with the Metal 1 interconnect stub from the driver. The overlap capacitance is the desired measurement. It is called a pseudo-inverter because the P-channel gate and the N-channel gate do not receive the same signal. V1 and V2 are non-overlapping periodic waveforms as shown in FIG. 2.

The V1 positive-going pulse discharges the output net, and then the V2 negative-going pulse charges it to the value of VDD(Cap) again. This average charging current in the VDD(Cap) supply can be measured and will be proportional to the total capacitance on the output of the pseudo-inverter, the power supply value and the frequency, through the expression, $I_{avg}=C*VDD(Cap)*F$, where F is the frequency of the periodic waveforms. The V1 and V2 pulses must not overlap so no current flows from the power supply to ground during the transitions. If several measurements of Iavg (average charging current) are made at different power supply values for a fixed frequency and Iavg is plotted against the power supply value, then the slope of the straight line result is CF. Dividing CF by the frequency yields the total capacitance. This value however, includes not only the cross-over capacitance desired but the capacitance of the driving stub and the drain capacitances of the transistors. In order to separate one from the other, a second pseudo-inverter is fashioned identical in layout to the first except the M2 line is missing. Capacitance of this reference structure is determined in the same manner as the test structure. The difference of the two capacitances is the cross-over capacitance desired.

The implementation of the test structure requires 6 pins for test such as VDD(Cap), VDD(NoCap), VSS, NWELL, V1 and V2. However, probe pad sizes and spacing are huge relative to the area required to implement the pseudo-inverters and interconnect structure, so this is a tremendous waste of silicon area. Large silicon area is very costly even for test chip work.

There have been efforts to reduce the number of required pins and minimize the silicon area. V1 and V2 can drive several test structures and reference structures in parallel and the reference structure with VDD(No Cap) can be common to several test structures, since it is not necessary to have one reference structure per test structure. For example, one of the conventional wafer probe pad patterns may be a 2×12 array including 2 columns×12 rows of probe pads. Assuming 24 probe pads, only 19 test structures may be able to be tested with a single 2×12 probe pad array since a total of 24 pins (including 19 pins for VDD_CAPs, a pin for VDD_NOCAP, and 4 pins for V1, V2, NWELL and VSS) are supported. With the growth of available metal layers on silicon, the number of test structures needed to fully characterize the metal system may be approximately 480. In other words, 26 of 2×12 probe pad arrays are required to fully characterize the metal system, assuming that 19 test structures are supported per 2×12 probe array. In such case, the silicon area required for all these probe pads is still excessively large. If the number of the test structures is limited to reduce the silicon area less than a prescribed or assigned area, the test chip may result in incomplete characterization.

Therefore, it would be desirable to provide a system for measuring capacitance with a minimum number of probe pad arrays which represent the total minimum area to accommodate the full set of required test structures.

SUMMARY OF THE INVENTION

Accordingly, the present invention provides a system for area efficient charge-based capacitance measurement requiring a minimum silicon area.

In an exemplary aspect of the present invention, a structure block for a chip capacitance measurement system is provided. The structure block includes several test structures coupled to a corresponding reference capacitance structure and a decode logic block. Each test structure includes a first PMOS transistor, a first NMOS transistor, and a test output. The decode logic block coupled to the several test structures selects a desirable test structure for test from the several test structures. A reference structure is identical to the test structures except it has no unique interconnect and is shared by several test structures. A current meter may be coupled to the structure block to measure currents in the desirable test structure and the reference structure. Consequently, a capacitance of the corresponding test capacitance structure is assessed through a conventional CBCM method. The assessed capacitance may include a parasite capacitance between two metallic layers, a metallic layer and a substrate, or the like. Additionally, the structure block includes a single output pin for busing the test outputs from the several test structures. The single output pin is coupled to a power source such as VDD_CAP. In this manner, the number of total pins may be reduced and, thus, the silicon area for probe pads may be minimized.

In another aspect of the present invention, multiple structure blocks may be utilized. An additional decode logic block is included to select a desirable structure block. Further, each structure block may have to include at least one reference structure. Thus, a user can add or remove reference structures to/from each structure block while maintaining at least one reference structure in the structure block.

It is to be understood that both the foregoing general description and the following detailed description are exemplary and explanatory only and are not restrictive of the invention as claimed. The accompanying drawings, which are incorporated in and constitute a part of the specification, illustrate an embodiment of the invention and together with the general description, serve to explain the principles of the invention.

BRIEF DESCRIPTION OF THE DRAWINGS

The numerous advantages of the present invention may be better understood by those skilled in the art by reference to the accompanying figures in which:

FIG. 1 illustrates an block diagram of a test structure implemented in a prior art;

FIG. 2 illustrates signals which drive the test structure in FIG. 1;

FIG. 3 illustrates a block diagram of a test structure block in accordance with an exemplary embodiment of the present invention;

FIG. 4 illustrates content of one of the test structures in FIG. 3 in accordance with an exemplary embodiment of the present invention;

FIG. 5 illustrates signals which drive the test structure in FIG. 4; and

FIG. 6 illustrates a block diagram of an exemplary system including multiple test structure blocks in accordance with an exemplary embodiment of the present invention.

DETAILED DESCRIPTION OF THE INVENTION

Reference will now be made in detail to the presently preferred embodiments of the invention, examples of which are illustrated in the accompanying drawings.

The present invention is directed to a system having test structures to measure interconnect capacitance to calibrate various extraction tools which typically require excessively large silicon area. The system may include several structure blocks each of which include multiple test structures. In order to reduce a total number of pins and minimize silicon area for probe pads, a single output pin is utilized per structure block. Several outputs for the multiple test structures may be bused into the single output pin through a single serial bus. The single output pin is suitable for being returned to a power supply such as VDD_CAP, and the like. As mentioned above, some prior art requires multiple output pins for several test structures, which increases the silicon area and, thus, increase the area penalty associated with the increased silicon area.

Referring to FIG. 3, a block diagram of a structure block 300 in accordance with the present invention is shown. In an embodiment of the present invention, the structure 300 may include various numbers of test structures. In FIG. 3, the structure block 300 includes 32 test structures 302–304 and a decode block 308. The 32 test structures are exemplary and described for illustration purposes only. Therefore, less or additional test structures may be employed. 32 BUS outputs (bus0, bus1 . . . bus31) for the 32 test structures may be bused into a single output pin 306. The single output pin 306 is suitable for being returned to the VDD_CAP power supply. Decoding and gating circuitry on the V2 and V1 pins of each test structure is represented by the 1-of-32 decode logic block (logic block) 308 and the OR2 gates 310–316. Consequently, only one of the 32 test structures is active at any one time, and the other 31 test structures do not interfere with a current measurement of the active test structures. A reference structure is one of test structures 302–304 and shared by rest of the test structures 302–304 in the structure block 300. For example, Test structure 31 may be the reference structure in the structure block 300. Test Structure 0–30 may share the reference structure (Test Structure 31). It is to be noted that the reference structure is identical to one of the 32 test structures except that the reference structure does not include the target capacitance structure.

Referring now to FIG. 4, a schematic block diagram of a test structure 400 employed in FIG. 3 is shown. A test structure 400 may be a charge-based capacitance measurement (CBCM) circuit. A full CBCM circuit conventionally includes two pairs of symmetrical and matching MOS transistor circuits. One transistor circuit includes a pair of PMOS transistors while the other transistor circuit includes a pair of NMOS transistors. In an embodiment of the present invention, the test structure 400 includes a PMOS 402 coupled to V2 signal and a NMOS 404 coupled to V1 signal. V1 and V2 signals include two non-overlapping signals 500 as shown in FIG. 5. It is to be noted that the two non-overlapping signals 500 may be identical to the non-overlapping period wave forms shown in FIG. 2.

Similarly, the corresponding reference structure may include a PMOS coupled to V2 signal and a NMOS coupled to V1 signal. The purpose of the non-overlapping signals (V1 and V2) is to ensure that only one of the two transistors in the test structure is conducting current at any given time. Thus, any short-circuit current from a power supply 410 to ground during the output transition is eliminated. In FIG. 4, when the PMOS transistor 402 turns on, it will draw charges from the power supply 410 to charge up a target test capacitance structure 406. This amount of charge will be subsequently discharged through the NMOS transistor 404 into ground. An average current from the test structure may be measured by a current meter 408. Then, an average current from the corresponding reference structure (not shown) may be measured by the current meter 408. The difference between two average current values measured from the test structure 400 and the corresponding reference structure may be used to extract the capacitance of the target test capacitance structure 406.

Referring back to FIG. 3, for the purposes of discussion, suppose the 5-bit select input bus (e.g. SEL [0:4]) 322 of the structure block 300 has all logic 0's. The 1-of-32 decode block (test structure logic block) 308 is configured to have the outputs active LO. Thus, the en0 signal is a logic 0 and en1 through en31 are all logic 1's. The action of the OR2 gates 310–316 causes clkp1 through clkp31 to be logic 1's. This turns PMOS transistors (i.e. pseudo-inverter P-channels) in those 31 test structures OFF, essentially disconnecting them from the corresponding output buses (bus0, bus1 . . . bus31). To prevent unwanted leakage currents through these OFF P-channels getting onto the output bus, the transistor is configured to have a high threshold voltage and non-minimum channel length. In this manner, any very small leakages that may still be present are effectively nullified out with the corresponding reference structure. The CLKN 318 and CLKP 320 signals are fanned out to the appropriate OR2 gates 310–316 and only clkn0 and clkp0 may switch in response to them. In this scenario, Test structure 304 is under test. By cycling through the 32 possible states of bits SEL0-SEL4, all 32 test structures may be able to be measured.

In an embodiment of the present invention, multiple structure blocks of 32 test structures, which is suitable for sharing the SEL[0:4], CLKP, and CLKN pins, may be instantiated in the system. In such a case, only one output bus pin needs to be added to an additional structure block and an additional SEL pin. For example, a second structure block (including 33–64 test structures) may require one extra SEL pin and a third structure block (including 65–128 test structures) may require another extra SEL pin, and the like. The corresponding reference structures for the structure blocks are treated no differently than any other test structures. In an embodiment of the present invention, a number of reference structures may not be restricted. The reference structures may be inserted as many times as desired.

As mentioned above, the number of test structures per structure block may vary. Any number of test structures may be configured to be implemented in accordance with the present invention. However, it is to be noted that the number of test structures may be restricted so as to keep the physical length of an output bus from getting excessively long. It is also contemplated that various types of probe pads may be utilized for testing. For example, in an embodiment of the present invention, a 2×12 probe pad array may be utilized. In order to minimize space, it is desirable to have "stacks" of 32 test structures to be approximately the same height as the probe pad array to further minimizes silicon area. In this manner, the test structures may not create empty space above the probe pad array.

In FIG. 6, a measuring system 600 including eight structure blocks 602–606 is illustrated. The eight blocks 602–606 of several test structures may be stacked up alongside of a 2×12 probe pad array. An additional decode logic block (structure block logic block) 608 may be required to select a desirable structure block from the eight structure blocks. The desirable structure block is the only active structure block at given time. Preferably, the system includes at least one corresponding reference structure (not shown) for each structure block 602–606. The system 600 may allow each probe pad array to support a large number of test structures, which leads to a reduction of the number of probe pads required and the corresponding silicon area.

For example, a corresponding reference structure may be implemented for a structure block 602–606 of 32 test structures. In the same example, when a 2×12 probe pad array is utilized, one 2×12 probe pad array may support 248 test structures and 8 reference structures. Thus, only two 2×12 arrays are required for the 480 test structures suggested previously in paragraph [007]. When the numbers of 2×12 arrays utilized in the example are compared to one of the above described prior art approaches, 13 times reduction in the number of 2×12 arrays may be achieved. Small extra area may be required to implement the decode logic and the OR2 gates. However the extra area is minimal and, thus, the total area reduction is nearly 13 times. Total pins required may be 20 pins including 8 selects, 8 output buses, and 4 pins including CLKP, CLKN, VDD, and VSS. There are extra 4 pins left over for additional use. The VDD may be used to provide power to the decode logic block and OR2 gates as well as provide the NWELL connection in the test and reference structures.

The present invention may provide various advantages. A single output pin may be required for each structure block. A single input pin may be shared by several test structures in each structure block, and the like. Consequently, the number of total pins required in the system is minimized. Testing time is also reduced due to the reduction of the total pins. Further, a small number of reference structures (preferably one reference structure per structure block) required may reduce silicon area compared to the prior art. Additionally, the present invention does not compromise accuracy of the test results since the number of test structures is not limited or reduced. As such, the present invention allows a complete characterization of the semiconductor back-end process.

In the exemplary embodiments, the methods disclosed may be implemented as sets of instructions or software readable by a device. Further, it is understood that the specific order or hierarchy of steps in the methods disclosed are examples of exemplary approaches. Based upon design preferences, it is understood that the specific order or hierarchy of steps in the method can be rearranged while remaining within the scope and spirit of the present invention. The accompanying method claims present elements of the various steps in a sample order, and are not necessarily meant to be limited to the specific order or hierarchy presented.

It is believed that the system for area efficient CBCM of the present invention and many of its attendant advantages will be understood by the forgoing description. It is also believed that it will be apparent that various changes may be made in the form, construction and arrangement of the components thereof without departing from the scope and spirit of the invention or without sacrificing all of its material advantages. The form herein before described being merely an explanatory embodiment thereof, it is the intention of the following claims to encompass and include such changes.

What is claimed is:

1. A structure block for a chip capacitance measurement system requiring minimum silicon area, comprising:
   a plurality of test structures coupled to a target test capacitance structure, each of test structures including a first PMOS transistor, a first NMOS transistor, and a test output;
   a decode logic block coupled to the plurality of test structures, for selecting a desirable test structure from the plurality of test structures; and
   a single output pin for busing each test output from the plurality of test structures through a single serial bus, wherein a corresponding reference structure is shared by each of the plurality of test structures.

2. The structure block as described in claim 1, wherein a capacitance of the target test capacitance structure is determined based on measurements of a current flowing through the desirable test structure and the corresponding reference structure.

3. The structure block as described in claim 1, wherein the single output pin is suitable for being returned to VDD_CAP.

4. The structure block as described in claim 1, wherein a power supply is coupled to the structure block and the corresponding reference structure.

5. The structure block as described in claim 1, wherein a current meter is coupled to the structure block and the corresponding reference structure.

6. The structure block as described in claim 1, wherein the corresponding reference structure is coupled to VDD_CAP.

7. The structure block as described in claim 1, wherein a first signal and a second signal which are not overlapping each other are utilized for the plurality of test structures.

8. The structure block as described in claim 7, wherein the first PMOS is driven by the first signal and the first NMOS is driven by the second signal.

9. The structure block as described in claim 1, wherein the capacitance includes a parasite capacitance between two metallic layers.

10. The structure block as described in claim 1, wherein the capacitance includes a parasite capacitance between a metallic layer and a substrate.

11. A chip capacitance measurement system, comprising:
a plurality of structure blocks, each of the plurality of structure blocks including,
a plurality of test structures coupled to a target test capacitance structure, each of the plurality of test structures including a test output;
a first logic block coupled to the plurality of test structures, for selecting a desirable test structure from the plurality of test structures;
a single output pin for busing each test output from the plurality of test structures through a single serial bus; and
at least one reference structure being shared by the plurality of test structures;
a second logic block coupled to the plurality of structure blocks, selecting desirable structure block from the plurality of structure blocks;
a power source for driving the plurality of structure blocks and the at least one reference structure, the single output pin coupled to the power source; and
a current meter device coupled to the power source for measuring currents in the at least one reference structure and the desirable test structures,
wherein the current meter device sequentially measures currents in the at least one reference structure and the desirable test structures.

12. A chip capacitance measurement system requiring minimum silicon area and total pins, comprising:
a plurality of structure blocks, each of the plurality of structure blocks including,
a plurality of test structures coupled to a target test capacitance structure, each of the plurality of test structures including a first PMOS transistor, a first NMOS transistor, and a test output;
a first logic block coupled to the plurality of test structures, for selecting a desirable test structure from the plurality of test structures;
a single output pin for busing each test output from the plurality of test structures through a single serial bus, the single output pin coupled to VDD_CAP; and
at least one reference structure being shared by the plurality of test structures,
wherein only the desirable test structure is active at a given time; and
a second logic block coupled to the plurality of structure blocks, selecting desirable structure block from the plurality of structure blocks,
wherein a capacitance of the target test capacitance structure is determined based on measurement of a current flowing through the desirable test structure and the at least one reference structure.

13. The chip capacitance measurement system as described in claim 12, wherein a number of probe pad arrays required is determined by numbers of the plurality of structure blocks and numbers of total pins required.

14. The chip capacitance measurement system as described in claim 12, wherein a first signal and a second signal which are not overlapping each other are utilized.

15. The chip capacitance measurement system as described in claim 12, wherein the first PMOS is driven by the first signal and the first NMOS is driven by the second signal.

16. The chip capacitance measurement system as described in claim 12, further comprising:
a power source for driving the plurality of structure blocks and the at least one reference structure.

17. The chip capacitance measurement system as described in claim 16, further comprising:
a current meter device coupled to the plurality of structure blocks and the power source for measuring currents,
wherein the current meter device is coupled to the at least one reference structure.

18. The chip capacitance measurement system as described in claim 13, wherein the plurality of test structures in each of the plurality of structure block are stacked to have approximately the same height as the probe pad array.

19. The chip capacitance measurement system as described in claim 12, wherein only the desirable structure block is active at a given time.

20. The chip capacitance measurement system as described in claim 12, wherein each of the plurality of test structures is suitable for being utilized as a reference structure.

21. The structure block as described in claim 14, wherein the plurality of test structures are stacked to have approximately a same height as a probe pad array.

22. The chip capacitance measurement system as described in claim 11, wherein only the desirable test structure is active and other test structures are inactive at a given time.

23. The chip capacitance measurement system as described in claim 11, wherein the power source includes VDD_CAP.

24. The chip capacitance measurement system as described in claim 11, wherein a capacitance of the target test capacitance structure of the desirable test structure is determined through charge-based capacitance measurement method.

* * * * *